(12) United States Patent
Nakagawa et al.

(10) Patent No.: US 6,869,736 B2
(45) Date of Patent: Mar. 22, 2005

(54) HALFTONE PHASE SHIFT PHOTOMASK AND BLANK FOR HALFTONE PHASE SHIFT PHOTOMASK

(75) Inventors: Hiro-o Nakagawa, Tokyo-to (JP); Toshiaki Motonaga, Tokyo-to (JP); Yoshinori Kinase, Tokyo-to (JP); Satoshi Yusa, Tokyo-to (JP); Shigeki Sumida, Tokyo-to (JP); Toshifumi Yokoyama, Tokyo-to (JP); Chiaki Hatsuta, Tokyo-to (JP); Junji Fujikawa, Tokyo-to (JP); Masashi Ohtsuki, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 188 days.

(21) Appl. No.: 10/363,604
(22) PCT Filed: Sep. 3, 2001
(86) PCT No.: PCT/JP01/07615
§ 371 (c)(1),
(2), (4) Date: Mar. 4, 2003
(87) PCT Pub. No.: WO02/21210
PCT Pub. Date: Mar. 14, 2002

(65) Prior Publication Data
US 2003/0186135 A1 Oct. 2, 2003

(30) Foreign Application Priority Data
Sep. 4, 2000 (JP) .............................. 2000-267552

(51) Int. Cl.$^7$ .............................................. G03C 5/00
(52) U.S. Cl. ......................................................... 430/5
(58) Field of Search ............................. 430/5, 322, 323, 430/324; 216/72

(56) References Cited

U.S. PATENT DOCUMENTS

| 5,482,799 A | | 1/1996 | Isao et al. ...................... 430/5 |
|---|---|---|---|
| 5,536,603 A | * | 7/1996 | Tsuchiya et al. ............... 430/5 |
| 6,599,667 B2 | * | 7/2003 | Yusa et al. ..................... 430/5 |

FOREIGN PATENT DOCUMENTS

| JP | 06-110193 | 4/1994 |
|---|---|---|
| JP | 08-076353 | 3/1996 |
| JP | 08-123010 | 5/1996 |

* cited by examiner

Primary Examiner—S. Rosasco
(74) Attorney, Agent, or Firm—Ladas & Parry LLP

(57) ABSTRACT

Disclosed is a blank for a halftone phase shift photomask comprising a transparent substrate and a halftone phase shift layer formed thereon, the halftone phase shift layer being provided with a layer containing molybdenum silicide as its major component and either one or both of oxygen and nitrogen and being formed of a multilayer film with two or more layers, wherein the multilayer film contains a layer whose major component is either one of chromium and tantalum or a chromium tantalum alloy and the layer whose major component is either one of chromium and tantalum or a chromium tantalum alloy is laminated on the side closer to the transparent substrate than the layer containing molybdenum silicide as its major component and either one or both of oxygen and nitrogen.

6 Claims, 10 Drawing Sheets

HALFTONE PHASE SHIFT PHOTOMASK AND BLANK FOR HALFTONE PHASE SHIFT PHOTOMASK

BACKGROUND OF THE INVENTION

1. Field of the Invention

The present invention relates to a photomask used to produce high-density integrated circuits such as LSIs and VLSIs and to a photomask blank used to produce the photomask, and, particularly, to a halftone phase shift photomask enabling the formation of a finely dimensional projected image and to a halftone phase shift photomask used to produce this phase shift photomask.

2. Prior Art

Semiconductor integrated circuits such as ICs, LSIs, VLSIs and the like are produced by repeated lithographic steps using a photomask. In order to attain, particularly, fine dimension, investigations on the use of a phase shift photomask such as those shown in, for example, EP 0 090 924A2 (JP-A-58-173744 and JP-B-62-59296) are being made. There have been proposals concerning phase shift photomasks having various structures.

Among these photomasks, halftone phase shift photomasks as shown in, for example, JP-A-4-136854 and U.S. Pat. No. 4,890,309 attract attention from the viewpoint of early practical use.

There have been a few proposals concerning an improvement in yield by a reduction in the number of production steps and structures and materials which can reduce costs as described in JP-A-5-2259 and JP-A-5-127361.

As will be explained in detail hereinbelow, this halftone phase shift photomask comprises a transparent substrate, a halftone phase shift film and as required, a light shading film.

In the meantime, as thin film materials for photomask patterns, molybdenum silicide as described in U.S. Pat. No. 4,985,319 (EP 0 190867, JP No. 1750121), U.S. Pat. No. 4,783,371 (JP No. 1781105) is generally known. Because its processing characteristics are superior, energetic trials have been made to apply molybdenum silicide to halftone phase shift films by oxidizing or nitriding molybdenum silicide as shown in, for example, JP-A-6-83027 and U.S. Pat. No. 5,474,864 (JP-A-7-140635).

However, molybdenum silicide is usually treated by dry etching using fluorine type etching gas such as $CF_4$, $CHF_3$, $SF_6$, $C_2F_6$, $NF_3$, $CF_4+H_2$ and $CBrF_3$. At this time, there is the problem that a transparent substrate using synthetic quartz as a substrate material is also etched and therefore highly precise dry etching cannot be attained.

Generally, as to the production of a halftone phase shift photomask, it is essential to control the phase angle with high accuracy. However, as aforementioned, the quartz substrate is also etched when etching the halftone phase shift film, with the result that an error in phase difference is produced corresponding to the amount to be etched.

Also, the etching of a halftone phase shift film has an important role in a pattern size control. It is therefore desired to set conditions so as to obtain better uniformity and reproducibility of a pattern dimension as much as possible. This adds a new parameter, namely etching selection ratio of the phase shift film to quartz, giving rise to the problem that a margin for condition setting is narrowed.

This is a problem which arises because an optimum etching process for dimensional control does not always accord to an optimum etching process in which the above phase difference control is regarded as important.

Specifically, this is a problem that although a molybdenum silicide type halftone phase shift film material itself exhibits superior processing characteristics and chemical stability after processed, highly precise patterning is made difficult taking also the highly precise control of phase difference into account.

SUMMARY OF THE INVENTION

Along with the use of a shorter wavelength as exposure wavelength associated with the micronization of LSI patterns, the attempts have been made to apply a molybdenum silicide type material corresponding to exposure using shorter wavelength to a halftone phase shift film in this manner. However, there is a problem that although a molybdenum silicide type halftone phase shift film material itself exhibits superior processing characteristics and chemical stability after processed, highly precise patterning is made difficult taking also the highly precise control of phase difference into account. Some measures coping with this problem have been demanded.

The present invention copes with this problem and it is an object of the present invention to provide a halftone phase shift photomask having a structure which uses a molybdenum silicide type halftone phase shift film material and is improved in etching selection ratio to a quartz substrate while maintaining the superb processability of the molybdenum silicide type material and the chemical stability of the molybdenum silicide type material after processed.

Another object of the present invention is to provide a blank for a halftone phase shift photomask which makes it possible to produce such a halftone phase shift photomask at the same time.

A blank for a halftone phase shift photomask according to the present invention comprises a transparent substrate and a halftone phase shift layer formed thereon, the halftone phase shift layer being provided with at least a layer containing molybdenum silicide as its major component and either one or both of oxygen and nitrogen and being formed of a multilayer film with two or more layers, wherein the multilayer film contains a layer whose major component is either one of chromium and tantalum or a chromium tantalum alloy and the layer whose major component is either one of chromium and tantalum or a chromium tantalum alloy is laminated on the side closer to the transparent substrate than the layer containing molybdenum silicide as its major component and either one or both of oxygen and nitrogen.

In the invention, the halftone phase shift layer is formed on the transparent substrate such that the phase difference $\phi$ given by the following equation falls in a range of $n\pi \pm \pi/3$ (n is an odd number).

$$\phi = \sum_{k=1}^{m-1} \times(k, k+1) + \sum_{k=2}^{m-1} 2\pi(u(k)-1)d(k)/\lambda$$

wherein $\phi$ is a phase change caused to the light vertically transmitting the photomask constituted of (m−2) halftone phase shift layers on the transparent substrate, $x(k, k+1)$ is a phase change effected at the interface between a $k^{th}$ layer and a $(k+1)^{th}$ layer, $u(k)$ and $d(k)$ are the refractive index and film thickness of a material constituting the $k^{th}$ layer respectively and $\lambda$ is the wavelength of exposure light, provided that the layer of k=1 is the transparent substrate and the layer of k=m is air.

In the invention, the halftone phase shift layer is formed on the transparent substrate in such a film thickness that the transmittance of the layer for exposure light falls in a range from 1 to 50% when the transmittance of the transparent substrate for the exposure light is defined as 100%.

A halftone phase shift photomask according to the present invention comprises a transparent substrate and a halftone phase shift layer formed thereon, the halftone phase shift layer being provided with at least a layer containing molybdenum silicide as its major component and either one or both of oxygen and nitrogen and being formed of a multilayer film with two or more layers, wherein the multilayer film contains a layer whose major component is either one of chromium and tantalum or a chromium tantalum alloy and the layer whose major component is either one of chromium and tantalum or a chromium tantalum alloy is laminated on the side closer to the transparent substrate than the layer containing molybdenum silicide as its major component and either one or both of oxygen and nitrogen.

In the invention, the halftone phase shift layer is formed on the transparent substrate such that the phase difference $\phi$ given by the following equation falls in a range of $n\pi \pm \pi/3$ ($n$ is an odd number).

$$\phi = \sum_{k=1}^{m-1} \times (k, k+1) + \sum_{k=2}^{m-1} 2\pi(u(k)-1)d(k)/\lambda$$

wherein $\phi$ is a phase change caused to the light vertically transmitting the photomask constituted of $(m-2)$ halftone phase shift layers on the transparent substrate, $x(k, k+1)$ is a phase change effected at the interface between a $k^{th}$ layer and a $(k+1)^{th}$ layer, $u(k)$ and $d(k)$ are the refractive index and film thickness of a material constituting the $k^{th}$ layer respectively and $\lambda$ is the wavelength of exposure light, provided that the layer of $k=1$ is the transparent substrate and the layer of $k=m$ is air.

In the invention, the halftone phase shift layer is formed on the transparent substrate in such a film thickness that the transmittance of the layer for exposure light falls in a range from 1 to 50% when the transmittance of the transparent substrate for the exposure light is defined as 100%.

The blank for a halftone phase shift photomask according to the present invention has such a structure, which thereby enables the provision of a blank for a halftone phase shift photomask capable of producing a halftone phase shift photomask having a structure in which a molybdenum silicide type halftone phase shift film material is used and which is improved in the etching selection ratio to a quartz substrate while maintaining the superb processing characteristics of the molybdenum silicide type material and the chemical stability of molybdenum silicide type material after processed.

Since the etching selection ratio to the transparent substrate such as synthetic quartz can be adopted in a sufficient wide range, while maintaining the applicability to short wavelengths which is peculiar to a silicide type besides the chemical stability and processing characteristics of a molybdenum type material. This makes it possible to provide a blank for a halftone phase shift photomask which enables highly precise patterning and has high stability after the mask is processed.

The halftone phase shift film is constituted of a multilayer film and one layer (the layer using either one of chromium and tantalum or an alloy of these metals as its major component) among the multilayer film is constituted of a material allowing a sufficiently large etching selection ratio to the transparent substrate, whereby highly precise processing can be attained.

This ensures that a highly precise halftone phase shift photomask can be attained in a high yield at low costs.

BRIEF DESCRIPTION OF THE DRAWINGS

In FIG. 2.

FIG. 3 is a sectional view in a process of producing the halftone phase shift photomask shown in FIG. 2a.

DESCRIPTION OF THE PREFERRED EMBODIMENT

Figure 1A:
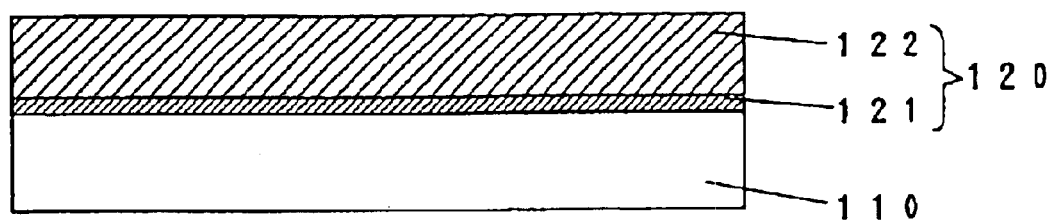
In FIG. 1, FIG. 1i a is a sectional view of a first example of an embodiment of a blank for a halftone phase shift photomask according to the present invention
FIG. 1b is a sectional view of a second example of an embodiment of a blank for a halftone phase shift photomask according to the present invention.

First, a halftone phase shift method and a halftone phase shift photomask will be explained briefly with reference to the drawing prior to the explanations of the present invention.

FIG. 6 is a view showing the principle of the halftone phase shift method and FIG. 7 is a view showing a conventional method using a perfect light shading film such as chromium.

Figure 6A:
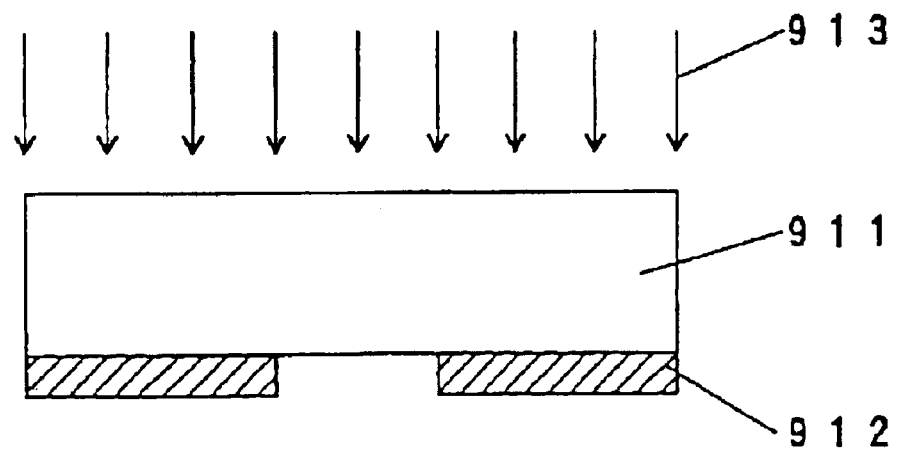
FIG. 6 is a view for explaining a halftone phase shift method.
Figure 6B:
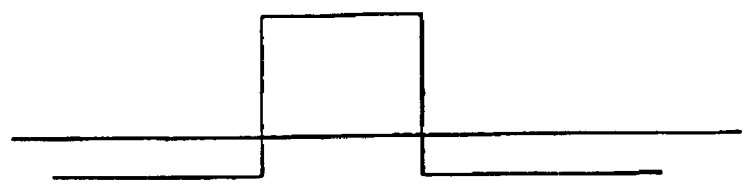
Figure 6C:
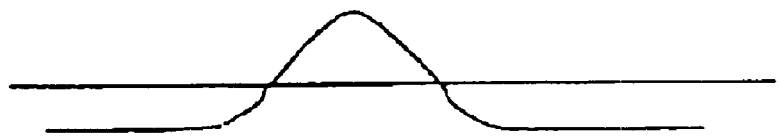
Figure 6D:
Figure 7A:
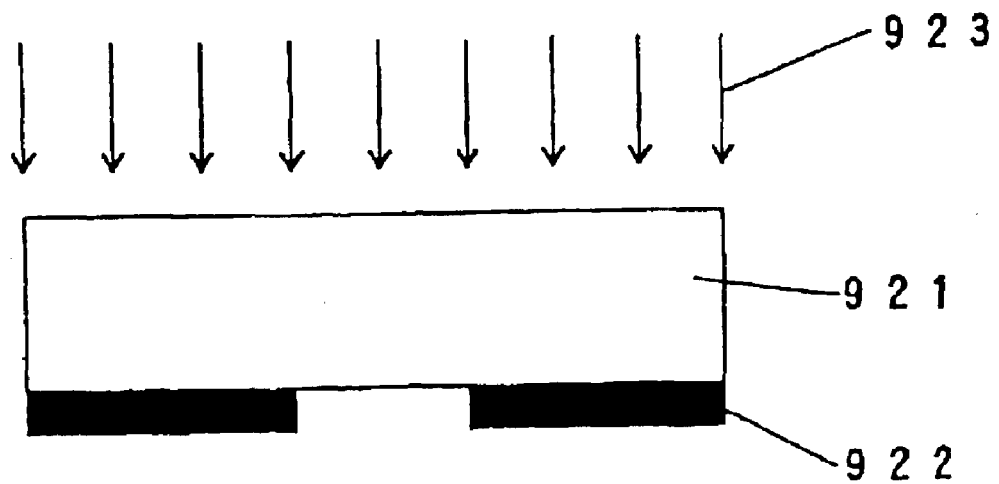
FIG. 7 is a view for explaining a transfer method (projecting exposure method) using a mask produced by a conventional method.
Figure 7B:
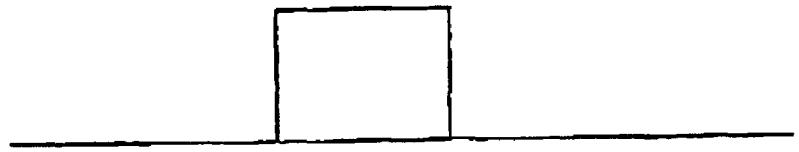
Figure 7C:
Figure 7D:

FIG. 6a and FIG. 7a respectively show a sectional view of a photomask, FIG. 6b and FIG. 7b respectively show the amplitude of light on a photomask, FIG. 6c and FIG. 7c respectively show the amplitude of light on a wafer and FIG. 6d and FIG. 7d respectively show the intensity of light on a wafer. 911 and 921 respectively show a substrate, 922 shows a perfect light shading film, 912 shows a halftone phase shift film which shifts the phase of incident light at an angle of substantially 180° and has a transmittance ranging from 1% to 50% and 913 and 923 respectively show incident light.

In the conventional method, as shown in FIG. 7a, a perfect light shading film 922 made of chromium or the like and a light transmitting section having a desired pattern are only formed on the substrate 921. The distribution of light intensity on a wafer is broadened toward the end as shown in FIG. 7d, leading to deteriorated resolution.

In the halftone phase shift method, on the other hand, the phase of the light transmitted through the halftone phase shift film 912 and the light transmitted through openings formed in the film are substantially reversed. Therefore, because light intensity at the pattern interface section on a wafer is 0, the distribution of light intensity can be prevented from being broadened toward the end and therefore the resolution can be improved.

It is demanded of the halftone phase shift film 912 of the halftone phase shift photomask to have two functions, namely, phase inversion and transmittance control.

As to the phase inversion function among these functions, it is only necessary that exposure light transmitting through the halftone phase shift film 912 and exposure light transmitting through openings formed in the film are substantially reversed.

Here, if the halftone phase shift film (called also a halftone phase shift layer) 912 is handled as an absorbing film shown in M. Born, E. Wolf "Principles of Optics" pp628–632, multiple interference can be neglected. Therefore, the phase change φ of vertical transmitting light is calculated based on the following equation. When φ falls in a range of nπ±π/3 (n is an odd number), the aforementioned shift effect is obtained.

$$\phi = \sum_{k=1}^{m-1} \times (k, k+1) + \sum_{k=2}^{m-1} 2\pi(u(k)-1)d(k)/\lambda$$

wherein φ is a phase change caused to the light vertically transmitting the photomask constituted of (m−2) halftone phase shift layers on the transparent substrate, x(k, k+1) is a phase change effected at the interface between a $k^{th}$ layer and a $(k+1)^{th}$ layer, u(k) and d(k) are the refractive index and film thickness of a material constituting the $k^{th}$ layer respectively and λ is the wavelength of exposure light, provided that the layer of k=1 is the transparent substrate and the layer of k=m is air.

On the other hand, the transmittance of the halftone phase shift film 912 for exposure light to obtain the halftone phase shift effect is determined by the dimension, area, position, shape and the like of a transfer pattern and namely differs depending on the pattern.

In order to obtain the above effect substantially, the transmittance of the halftone phase shift film 912 for exposure light necessarily falls in a range of the optimum transmittance±several percentages of the optimum transmittance as a center which optimum transmittance is decided by the pattern.

This optimum transmittance largely fluctuates in a range as wide as 1% to 50% depending on the transfer pattern when the transmittance of the opening portion is defined as 100%.

Namely, halftone phase shift photomasks having various transmittances are demanded to cope with all patterns.

Actually, the phase inversion function and the transmittance control function are determined by complex index of refraction (refractive index and extinction coefficient) and film thickness of the material constituting a halftone phase shift film (the materials constituting each layer in the case of a multilayer).

Namely, on the premise that the film thickness of the halftone phase shift film is controlled, materials having the characteristics that the phase difference φ determined by the above equation falls in a range of nπ±π/3 (n: odd number) may be used.

The present invention suitable for such a halftone phase shift photomask or a blank for producing this photomask will be explained in detail based on embodiments hereinbelow.

Concretely, the object of the present invention is attained by the provision of a blank for a halftone phase shift photomask comprising a transparent substrate and a halftone phase shift layer formed thereon, the halftone phase shift layer being provided with a layer containing molybdenum silicide as its major component and either one or both of oxygen and nitrogen and being formed of a multilayer film with two or more layers, wherein the multilayer film contains a layer whose major component is either one of chromium and tantalum or a chromium tantalum alloy and the layer whose major component is either one of chromium and tantalum or a chromium tantalum alloy is laminated on the side closer to the transparent substrate than the layer containing molybdenum silicide as its major component and either one or both of oxygen and nitrogen.

Namely, highly precise patterning can be accomplished by laminating the layer whose major component is either one of chromium and tantalum or a chromium tantalum alloy on the side closer to the transparent substrate than the layer containing molybdenum silicide as its major component and either one or both of oxygen and nitrogen.

The film using either one of chromium and tantalum or a chromium tantalum alloy as its major component may be etched also by chlorine type etching gas such as $Cl_2$, $CH_2Cl_2$ or gases prepared by adding $O_2$ to these gases. However, transparent substrates made of synthetic quartz or the like cannot be substantially etched by these chlorine type gases.

Here, the film in which either one of chromium and tantalum or a chromium tantalum alloy is used as its major component is desirably formed as a first layer just above the transparent substrate taking its role into account.

In the patterning, for example, in the case where a film containing either one of chromium or tantalum or a chromium tantalum alloy as its major component is first formed on synthetic quartz and a layer containing molybdenum silicide as its major component and either one or both of oxygen and nitrogen is formed on the above film to make a halftone phase shift film comprising these two layers, the layer containing molybdenum silicide as its major component and containing either one or both of oxygen and nitrogen is first etched using fluorine type dry etching gas and in succession, chlorine type dry etching gas is used to carry out patterning with maintaining a sufficient dry etching selection ratio to the substrate, whereby the phase difference can be controlled with high precision.

Also, this halftone phase shift film has high chemical stability and processability which are the characteristics of a molybdenum type thin film and also uses a silicide film. The halftone phase shift film therefore has sufficient transmittancy in lithography using a krypton fluoride excimer laser (exposure wavelength: 248 nm) or an argon fluoride excimer laser (exposure wavelength: 193 nm). So, this halftone phase shift film may be used as a usual halftone phase shift film.

Meanwhile, in many processes using halftone phase shift lithography, a layer formed of a light shading film is usually formed besides a halftone phase shift layer to prevent a resist from being sensitized by light on overlapped portions among neighboring shots.

Also, there is the case where this light shading film is used for the purpose of controlling the transfer characteristics of a pattern to be formed by transfer in addition to the above purpose.

A film using chromium primarily is used for this light shading film, for example, from the reason that it has superior plate-making characteristics and high durability. There is the case where after a halftone phase shift film pattern is formed, etching in succession to plate-making is carried out using a cerium nitrate type wet etchant.

On the contrary, in the blank for a halftone phase shift mask according to the present invention;

when a layer containing chromium as its major component is included as the halftone phase shift film, there is a fear that this film is attacked by the cerium nitrate type wet etchant (see FIG. 5(d) for the processing as will be explained later) to cause pattern defects. However, the corrosion resistance of the film can be improved by containing oxygen, nitrogen and the like in the film containing chromium as its major component.

Of course, the corrosion resistance can also be improved by using a chromium tantalum alloy in place of chromium.

It is to be noted that the film containing either one of chromium and tantalum or a chromium tantalum alloy as its major component is thin and there is therefore a less possibility of the film being attacked as shown in FIG. 5. Even if the film is attacked, the damage is assumed to be such a level at which substantially no problem concerning transfer characteristics arises.

The halftone phase shift photomask of the present invention is made to have such a structure and it is therefore possible to provide a halftone phase shift film which ensures highly precise patterning, has high chemical stability after the mask is processed and is adaptable to exposure to light having short wavelengths such as a krypton fluoride excimer laser (wavelength: 248 nm) or an argon fluoride excimer laser (wavelength: 193 nm).

Here, in the film containing chromium as its major component, for example, a chromium layer, chromium oxide layer, chromium nitride layer or chromium oxynitride layer may be used, though the film is not limited to these layers. Also, the film may be controlled by compounding atoms other than oxygen and nitrogen according to the need. Further, the film may contain Fe, Nb, Si, Y, Ce and the like as avoidable impurities. No particular limitation is imposed on the ratio of each component in the film containing chromium as its major component.

Similarly, in the film containing tantalum as its major component, for example, a tantalum layer, tantalum oxide layer, tantalum nitride layer or tantalum oxynitride layer may be used, though the film is not limited to these layers. Also, the film may be controlled by compounding atoms other than oxygen and nitrogen according to the need. Further, the film may contain Fe, Nb, Si, Y, Ce and the like as avoidable impurities. No particular limitation is imposed on the ratio of each component in the film containing tantalum as its major component.

Further, in the film containing a chromium tantalum alloy as its major component, for example, a chromium tantalum layer, chromium tantalum oxide layer, chromium tantalum nitride layer or chromium tantalum oxynitride layer may be used, though the film is not limited to these layers. In this case, no particular limitation is imposed on the ratio of chromium to tantalum and an optional ratio may be adopted. Also, the film may be controlled by compounding atoms other than oxygen and nitrogen according to the need. Further, the film may contain Fe, Nb, Si, Y, Ce and the like as avoidable impurities. No particular limitation is imposed on the ratio of each component in the film containing tantalum as its major component.

Such a chromium film, tantalum film and chromium tantalum film, or films of oxides, nitrides or oxynitrides of these metals can be easily formed by a sputtering method which has been used to form a thin film for a photomask.

In the case of carrying out sputtering by using metal tantalum, metal chromium, or the both as an target, a metal tantalum film, a metal chromium film or a chromium tantalum alloy film is obtained when using only argon gas as sputtering gas and films of an oxide, nitride or oxynitride of these metals are obtained when adding oxygen or nitrogen to the above sputtering gas.

The refractive index of each of these films may be controlled also by changing sputtering pressure and sputtering current besides the ratio of these gases.

Also, these chromium type, tantalum type and chromium tantalum type films may be formed using filming techniques such as a vapor deposition method, CVD method, ion plating method or ion beam sputtering method besides a sputtering method.

On the other hand, no particular limitation is imposed on the atomic ratio of molybdenum to silicon in molybdenum silicide contained in the layer containing molybdenum silicide as its major component and either one of oxygen and nitrogen or the both. Also, no particular limitation is imposed on each content of oxygen and nitrogen. It is also possible to mix atoms other than oxygen and nitrogen according to the need. Further, Fe, Nb, Si, Y, Ce and the like may be contained as avoidable impurities.

As to the molybdenum silicide oxide film, molybdenum silicide nitride film, molybdenum silicide oxynitride film and the like, these films are obtained if metal silicide is used as a target and oxygen or nitrogen is mixed with inert gas such as argon as sputtering gas in the same manner as above.

The refractive index of the molybdenum silicide oxide film, molybdenum silicide nitride film or molybdenum silicide oxynitride film may also be controlled by sputtering pressure and sputtering current besides the ratio of gases to be mixed.

The layer containing molybdenum silicide as its major component and either one of oxygen and nitrogen or the both may also be formed using filming techniques such as a vapor deposition method, CVD method, ion plating method or ion beam sputtering method besides a sputtering method.

Examples of an embodiment of the present invention will be explained with reference to the drawings.

Figure 1B:
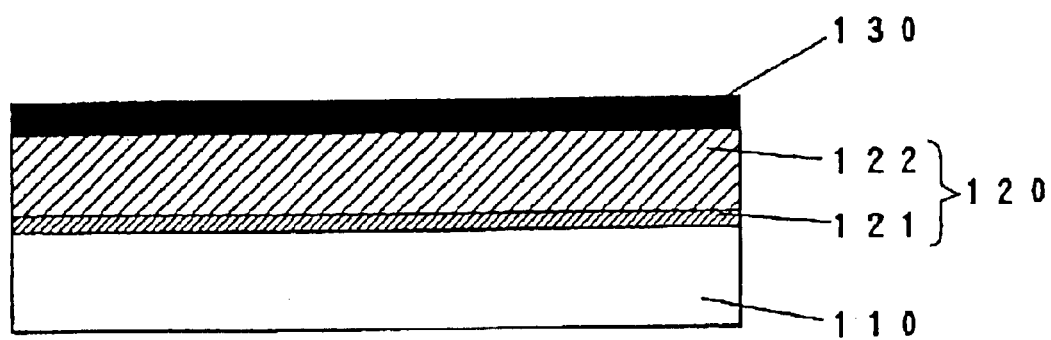
Figure 2A:
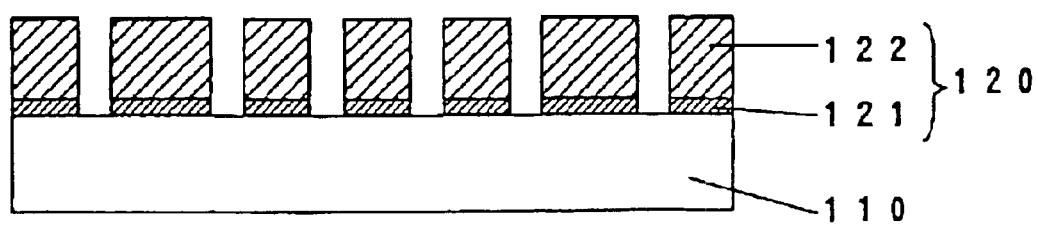
FIG. 2a is a sectional view of a first example of an embodiment of a halftone phase shift photomask according to the present invention and FIG. 2b is a sectional view of a second example of an embodiment of a halftone phase shift photomask according to the present invention.
Figure 2B:
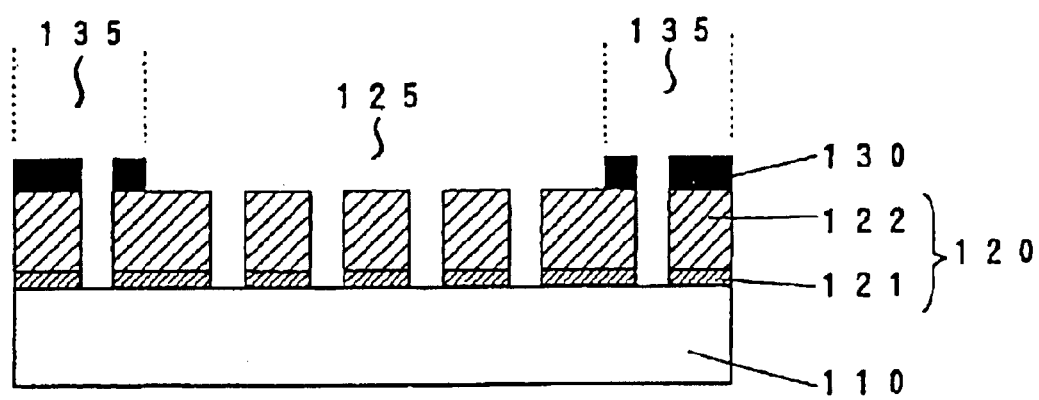

FIG. 1a is a sectional view of a first example of an embodiment of the blank for a halftone phase shift photomask according to the present invention, FIG. 1b is a sectional view of a second example of an embodiment of the blank for a halftone phase shift photomask according to the present invention, FIG. 2a is a sectional view of a first example of an embodiment of the halftone phase shift photomask according to the present invention and FIG. 2b is a sectional view of a second example of an embodiment of the halftone phase shift photomask according to the present invention. Also, FIG. 3 is a sectional view in a process of producing the halftone phase shift photomask shown in FIG. 2a, FIG. 4 is a sectional view of a test piece and FIG. 5 is a sectional view for explaining a method of producing the halftone phase shift photomask of the second example and for explaining an etched shape.

In FIG. 1, 110 represents a transparent substrate, 120 represents a halftone phase shift layer, 121 represents a layer (hereinafter also called a first layer) containing either one of chromium and tantalum or a chromium tantalum alloy as its major component, 122 represents a layer (hereinafter also called a second layer) containing molybdenum silicide as its major component and either one of oxygen and nitrogen or the both, 125 represents a halftone pattern area (also called a shift layer pattern area), 130 represents a light shading layer (also called a substantial light shading film), 140 represents a resist layer, 140A represents an opening, 145 represents a resist layer and 145A represents an opening.

First, the first example of an embodiment of a blank for a halftone phase shift photomask according to the present invention will be explained with reference to FIG. 1a.

The blank for a halftone phase shift photomask in this example comprises a multilayer film consisting of the second layer 122 containing molybdenum silicide as its major component and either one of oxygen and nitrogen or the both and the first layer 121 containing either one of chromium and tantalum or a chromium tantalum alloy as the halftone phase shift layer 120. The first layer 121 containing either one of chromium and tantalum or a chromium tantalum alloy and the second layer 122 containing molybdenum silicide as its major component and either one of oxygen and nitrogen or the both are formed in this order on the transparent substrate 110 made of synthetic quartz.

The blank for a halftone phase shift photomask in this example has chemical stability and processability inherent to a molybdenum type material and also allows to adopt a wide etching selection ratio to the transparent substrate 110 made of synthetic quartz in the case of etching the first layer 121 by using a chlorine type gas when producing a photomask.

This ensures highly precise patterning when producing a photomask.

The halftone phase shift layer 120 of the blank for a halftone phase shift photomask is provided with the second layer 122 containing molybdenum silicide as its major component and either one of oxygen and nitrogen or the both, whereby the photomask produced using this blank is applicable to short wavelength exposure light such as a krypton fluoride excimer laser (wavelength: 248 nm) and argon fluoride excimer laser (wavelength: 193 nm).

In this example, the halftone phase shift layer 120 is formed on the transparent substrate 110 such that the phase difference φ given by the following equation (m=4) falls in a range of nπ±π/3 (n is an odd number) so as to obtain a phase shift effect when producing the halftone phase shift photomask.

$$\phi = \sum_{k=1}^{3} \times(k, k+1) + \sum_{k=2}^{3} 2\pi(u(k)-1)d(k)/\lambda$$

wherein φ is a phase change caused to the light vertically transmitting the photomask constituted of two halftone phase shift layers 120 on the transparent substrate 110, x(k, k+1) is a phase change effected at the interface between a $k^{th}$ layer and a $(k+1)^{th}$ layer, u(k) and d(k) are the refractive index and film thickness of a material constituting the $k^{th}$ layer respectively and λ is the wavelength of exposure light, provided that the layer of k=1 is the transparent substrate 110 and the layer of k=4 is air.

Also, in order to obtain a phase shift effect substantially when producing a halftone phase shift photomask, the halftone phase shift layer 120 is formed on the transparent substrate 110 in such a film thickness that the transmittance of the halftone phase shift layer 120 for exposure light falls in a range from 1% to 50% when the transmittance of the transparent substrate 110 for the exposure light is defined as 100%.

Examples of the first layer 121 containing either one of chromium and tantalum or a chromium tantalum alloy include those which can be etched by chlorine type gas.

As the layer containing chromium as its major component, typically a chromium layer, chromium oxide layer, chromium nitride layer or chromium oxynitride layer is used as mentioned above.

As the layer containing tantalum as its major component, typically a tantalum layer, tantalum oxide layer, tantalum nitride layer or tantalum oxynitride layer is used as mentioned above.

Also as the layer containing chromium tantalum alloy as its major component, typically a chromium tantalum layer, chromium tantalum oxide layer, chromium tantalum nitride layer or chromium tantalum oxynitride layer is used as mentioned above.

The second layer 122 containing molybdenum silicide as its major component and either one of oxygen and nitrogen or the both can be formed easily by a sputtering method which has been used for the formation of a thin film for a photomask as mentioned above.

Synthetic quartz used for the transparent substrate 110 is transparent to short wavelength exposure light such as a krypton fluoride excimer laser (wavelength: 248 nm) and an argon fluoride excimer laser (wavelength: 193 nm). In the case of etching the first layer 121 containing either one of chromium and tantalum or a chromium tantalum alloy as its major component by using a chlorine type gas when producing a photomask, a wide etching selection ratio between the first layer 121 and the transparent substrate 110 is adopted.

Next, a second example of an embodiment of the blank for a halftone phase shift photomask according to the present invention will be explained with reference to FIG. 1b. The blank for a halftone phase shift photomask in the second example is provided with a light shading layer 130 formed on the phase shift layer 120 of the first example.

The light shading layer 130 is disposed on the periphery of the halftone pattern area (shift layer pattern area) 125 and is a substantially light shading film which, for example, prevents light sensitization caused by multiple exposure among neighboring shots and is used to form an alignment mark.

The light shading layer 130 is formed of, though not limited to, for example, a chromium type metal layer such as a chromium single layer, chromium oxide layer, chromium nitride layer and chromium oxynitride layer.

These chromium type films may also be formed using filming techniques such as a vapor deposition method, CVD method, ion plating method or ion beam sputtering method besides a sputtering method.

When producing the halftone phase shift photomask, a blank used in the case of carrying out wet etching of the light shading layer 130 by using a cerium nitrate type wet etchant is preferably improved in corrosion resistance by compounding oxygen, nitrogen and the like in the first layer 121 containing chromium as its major component.

Next, a first example of an embodiment of the halftone phase shift photomask of the present invention will be explained with reference to FIG. 2a.

This example is produced using the halftone phase shift photomask blank of the first example shown in FIG. 1a and is provided with a phase shift layer 120 having a pattern with a specified shape.

The explanations of the halftone phase shift photomask blank in the first example shown in FIG. 1a are substituted for explanations of the materials and optical characteristics of each layer and explanations of these materials and optical characteristics are omitted.

Next, a second example of an embodiment of the halftone phase shift photomask of the present invention will be explained with reference to FIG. 2b.

This example is produced using the halftone phase shift photomask blank of the second example shown in FIG. 1b and is provided with a phase shift layer 120 having a pattern with a specified shape and also with a halftone pattern area (shift layer pattern area) 125 used to obtain a phase shift effect and a light shading pattern area 135 used to obtain a substantial light shading effect.

The explanations of the halftone phase shift photomask blank in the second example shown in FIG. 1b are substituted for explanations of the materials and optical characteristics of each layer and explanations of these materials and optical characteristics are omitted.

Next, an example of a method of producing the halftone phase shift photomask of the first example will be explained with reference to FIG. 3.

Figure 3A:
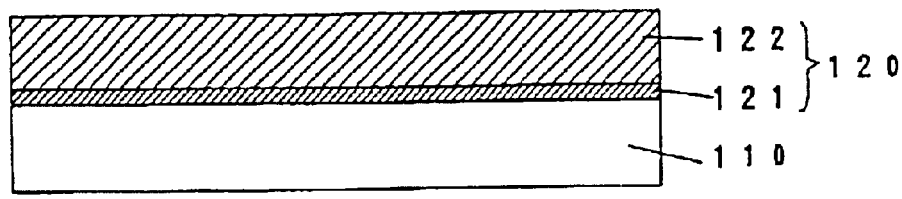
Figure 3B:
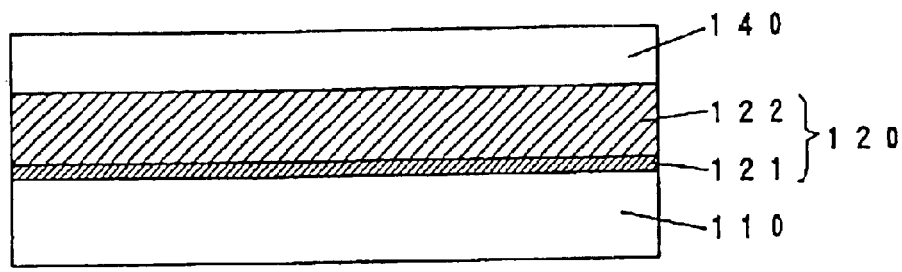
Figure 3C:
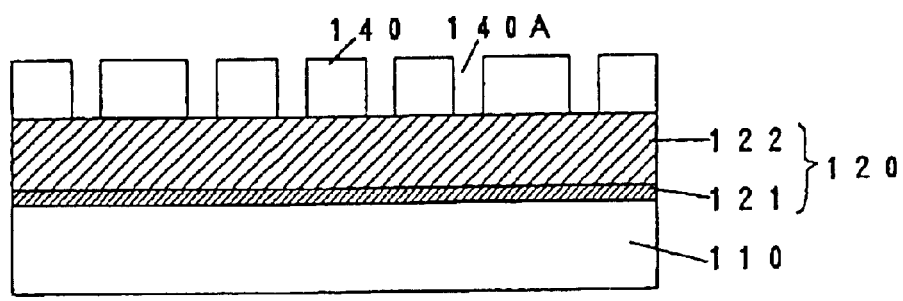
Figure 4:
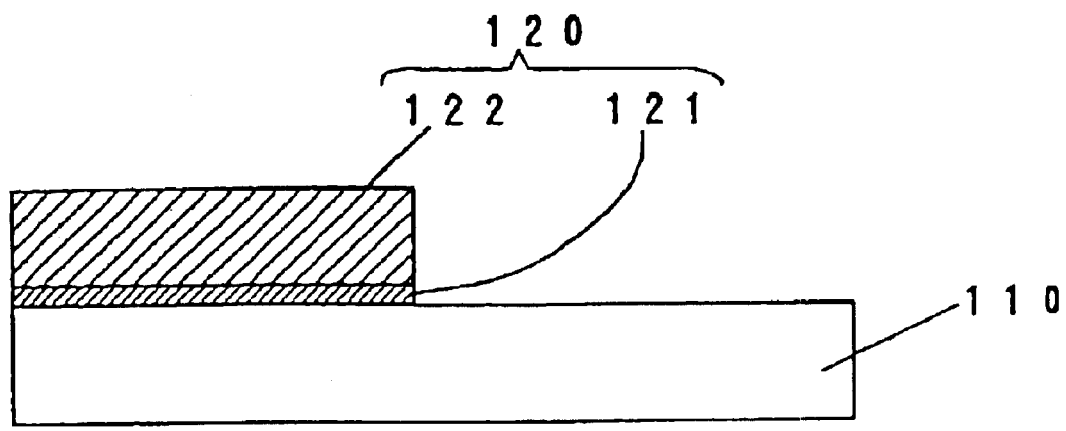
FIG. 4 is a sectional view of a test piece.

First, the halftone phase shift photomask blank of the first example shown in FIG. 1a is prepared (FIG. 3a) and a resist layer 140 is applied to the halftone phase shift layer 120 and dried (FIG. 3b). Then, only a specified area of the resist layer 140 is sensitized using an electron beam drawing device and developed to form the resist layer 140 in accordance with the pattern shape of the halftone phase shift layer 120 (FIG. 3c).

Although the resist used to form the resist layer 140 is preferably those having high processability, necessary resolution characteristics and high resistance to dry etching, there is no particular limitation to the resist material.

Figure 3D:
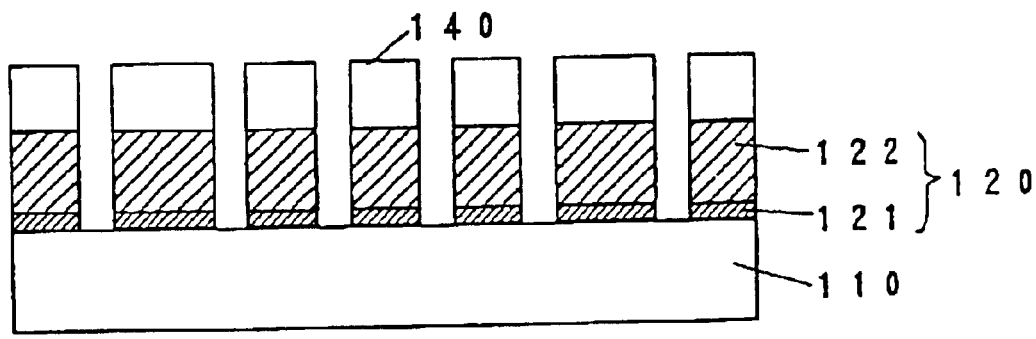
Figure 3E:
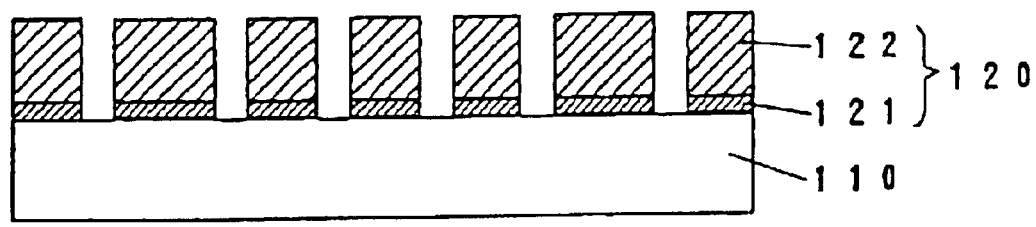

Using the resist layer 140 as an etching-resistant mask, the second layer 122 containing molybdenum silicide of halftone phase shift layer as its major component and either one of oxygen and nitrogen or the both and the first layer 121 containing either one of chromium and tantalum or a chromium tantalum alloy as its major component are successively etched using fluorine type gas and chlorine type gas in this order (FIG. 3d). The resist layer 140 is peeled off to obtain a halftone phase shift layer pattern (FIG. 3e).

Next, an example of a method of producing the halftone phase shift layer pattern of the second example will be explained with reference to FIG. 5.

Here, the light shading layer 130 is formed of a chromium type light shading layer.

First, the halftone phase shift photomask blank of the example 2 shown in FIG. 1b is prepared and a resist layer having a specified shape is formed on the light shading layer 130 in the same manner as in the method of producing the halftone phase shift photomask of the first example shown in FIG. 3. Using the resist layer as an etching-resistant mask, the light shading layer 130 was etched using chlorine type gas, the second layer 122 containing molybdenum silicide as its major component and either one of oxygen and nitrogen or the both is etched using fluorine type gas and the first layer 121 containing either one of chromium and tantalum or a chromium tantalum alloy as its major component is etched using chlorine type gas successively.

Figure 5A:
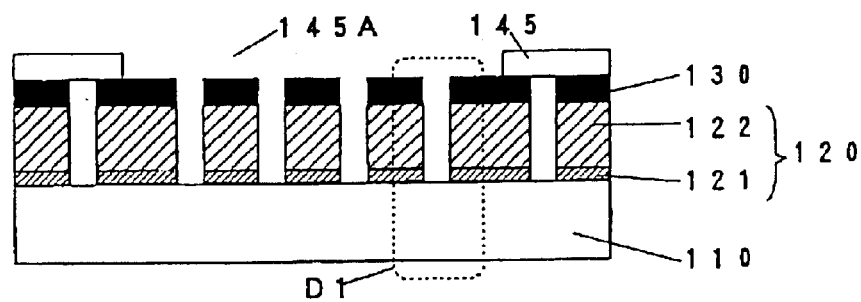
FIG. 5 is a sectional view for explaining a method of producing the halftone phase shift photomask of the second example and for explaining an etched shape.
Figure 5B:
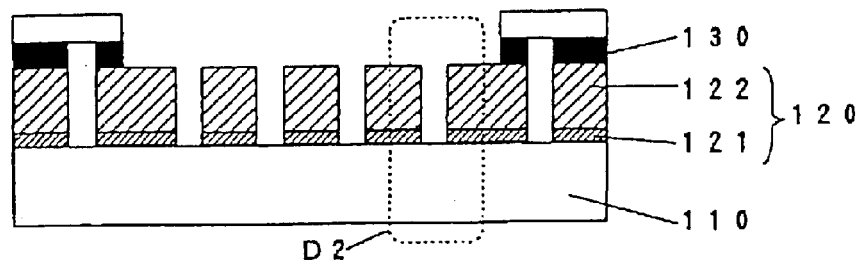

Then, the resist layer is peeled off and a resist layer provided with an opening 145A having a specified shape is newly formed on the light shading layer 130 in the same manner (FIG. 5a). Using the resist layer 145 as an etching-resistant mask, wet etching is carried out using a cerium nitrate type wet etchant (FIG. 5b). The resist layer 145 is peeled off to obtain a halftone phase shift photomask of a second example 2 shown in FIG. 2b.

Figure 5C:
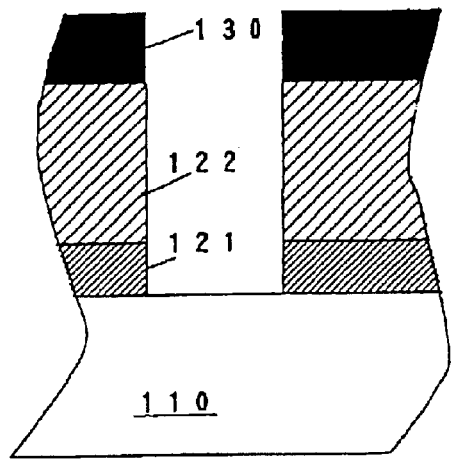
Figure 5D:
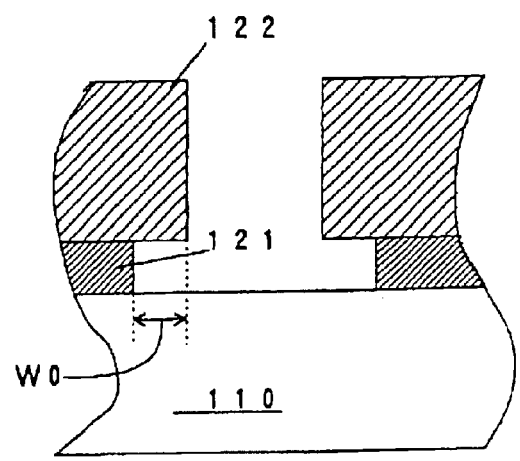

When carrying out the wet etching, the first layer 121 containing either one of chromium and tantalum or a chromium tantalum alloy as its major component is etched and put in such a state as shown by an enlarged view of FIG. 5d. There is a fear that a pattern defect is caused. However, because the film 121 containing either one of chromium and tantalum or a chromium tantalum alloy as its major component generally has a low film thickness, the possibility of the film 121 being attacked is low as aforementioned.

Even if the film is attacked, the damage is assumed to be such a level at which substantially no problem concerning transfer characteristics arises.

Incidentally, views obtained by enlarging the D1 section of FIG. 5a and the D2 section of FIG. 5b are FIG. 5c and FIG. 5d respectively.

The film 121 containing either one of chromium and tantalum or a chromium tantalum alloy as its major component is improved in corrosion resistance by compounding oxygen, nitrogen and the like in chromium or by using the chromium tantalum alloy.

Namely, W0 shown in FIG. 5d can be made very small and it is therefore surely possible to be free from the problem concerning transfer characteristics.

EXAMPLES

Example 1

Example 1 is an example in which the halftone phase shift photomask of the first example shown in FIG. 2a was produced using the halftone phase shift photomask blank of the first example shown in FIG. 1a and the production method shown in FIG. 3.

Example 1 will be explained hereinbelow with reference to FIG. 1, FIG. 2 and FIG. 3.

First, a halftone phase shift film 120 consisting of a first layer 121 containing a chromium tantalum alloy as its major component and a second layer 122 containing molybdenum silicide as its major component and oxygen was formed on a transparent substrate 110, with the first layer and second layer being formed in this order on the substrate 110, in the following manner, to form a halftone phase shift photomask blank.

The produced halftone phase shift photomask blank serves to produce a halftone phase shift photomask for KrF exposure, wherein a high purity synthetic quartz substrate which is 2 by 2 in. square and 0.25 in. thick is used as the transparent substrate 110.

First, the first layer 121 constituting the halftone phase shift layer 120 and containing a chromium tantalum alloy as its major component was formed in a thickness of about 10 nm on one surface of the transparent substrate 110, which was optically polished and thoroughly washed, in the condition shown below.

<Sputtering Conditions for the First Layer 121>

Filming apparatus: Planer type DC Magnetron Sputtering apparatus

Target: Tantalum: Chromium=9:1

Gas and flow rate: Argon gas 70 sccm

Sputtering pressure: 0.35 pascals

Sputtering current: 5.0 amperes

Next, the second layer 122 containing molybdenum silicide as its major component and oxygen and constituting the halftone phase shift layer 120 was successively formed on the first layer in the following condition.

Here, the film thickness was about 140 nm.

<Sputtering Conditions for the Second Layer 122>

Filming apparatus: Planer type DC Magnetron Sputtering apparatus

Target: Molybdenum: silicon=1:4 (atomic ratio)

Gas and flow rate: Argon gas 50 sccm+oxygen gas 50 sccm

Sputtering pressure: 0.3 pascals

Sputtering current: 3.5 amperes

A halftone phase shift photomask blank (transmittance: 6%) of an example 1 for KrF excimer laser exposure as shown in FIG. 1(a) was thereby obtained.

In addition, a sample (test piece shown in FIG. 4) was produced in which a step was formed using a lift-off method in which a film was formed on a synthetic quartz substrate masked with a tape in the same condition and the mask was peeled off after the film was formed. Using this sample, the phase difference and transmittance for 248 nm light were measured by a phase difference measuring device (MPM248, manufactured by Laser Tech), to find that the phase difference and the transmittance were 179.22° and 5.88% respectively.

Next, using the halftone phase shift photomask blank obtained in the above manner, a halftone phase shift photomask of a first example shown in FIG. 2(a) was produced in the following manner.

First, a resist 140 (ZEP 7000, manufactured by Nippon Zeon Co., Ltd.) containing an organic compound as its major component was applied to the halftone phase shift layer 120 of the resulting halftone phase shift mask blank (FIG. 3a) and dried (FIG. 3b). Only a specified area of the resist was exposed to light by using an electron beam drawing device, followed by developing, to obtain a resist layer 140 having a desired shape (FIG. 3c).

Next, using a commercially available photomask dry etcher (VLR700, manufactured by PTI), the halftone phase shift layer 120 exposed from the resist layer 140 was selectively dry-etched by exposing the layer 120 to a high density plasma, to obtain a desired pattern of the halftone phase shift layer 120 (FIG. 3d).

Here, the second layer 122 containing molybdenum silicide as its major component and oxygen and the first layer 121 containing a chromium tantalum alloy as its major component in the halftone phase shift layer 120 were successively etched.

It is to be noted that the used dry etcher had two etching process chambers and the following etching conditions 1 and 2 were those used in each process chamber.

| <Etching condition 1> | |
| --- | --- |
| Etching gas | $CF_4$ |
| Gas pressure | 10 mTorr |
| ICP power (high density plasma was produced) | 950 W |
| Bias power (drawing power) | 50 W |
| Time | 360 seconds |
| <Etching condition 2> | |
| Etching gas | $Cl_2$ gas |
| Gas pressure | 3 mTorr |
| ICP power (high density plasma was produced) | 250 W |
| Bias power (drawing power) | 25 W |
| Time | 200 seconds |

Next, the remainder resist layer 140 was peeled off by a usual method to obtain a halftone phase shift photomask having a transmittance of 6% for 248 nm light (FIG. 3e).

Here, it is to be noted that synthetic quartz which is the transparent substrate 110 is not almost etched in etching performed under the etching condition 2 and it is therefore possible to control phase difference with considerably high accuracy.

The obtained halftone phase shift photomask could be put to practical use from the viewpoint of all of the dimensional accuracy of the portion left after the peeling, sectional shape, the distribution of film thickness, the distribution of transmittance and the adhesion of the film to the substrate.

Example 2

Example 2 is an example in which the halftone phase shift photomask of the second example shown in FIG. 2b was produced using the halftone phase shift photomask blank of the second example shown in FIG. 1b and the production method shown in FIG. 3 or FIG. 5.

Example 2 will be explained hereinbelow with reference to FIG. 1, FIG. 2, FIG. 3 and FIG. 5.

First, a halftone phase shift film 120 consisting of a first layer 121 containing a chromium tantalum alloy as its major component and a second layer 122 containing molybdenum silicide as its major component and oxygen, with the first layer and second layer being formed in this order on a transparent substrate 110, and a light shading layer 130 made of chromium were formed on the transparent substrate 110 in the following manner, to form a halftone phase shift photomask blank.

Here, the first layer among these two layers constituting the halftone phase shift film is made of a chromium tantalum alloy to thereby accomplish an improvement in corrosion resistance.

Specifically, the light shading layer 130 made of chromium when producing the halftone phase shift photomask was improved in corrosion resistance to a cerium nitrate type wet etchant when wet-etched using the etchant.

Also in the case of Example 2, the produced halftone phase shift photomask blank serves to produce a halftone phase shift photomask for KrF exposure, wherein a high purity synthetic quartz substrate which is 2 by 2 in. square and 0.25 in. thick is used as the transparent substrate 110.

First, the first layer 121 constituting the halftone phase shift layer 120 and containing a chromium tantalum alloy as its major component was formed in a thickness of about 10 nm on one surface of the transparent substrate 110, which was optically polished and thoroughly washed, in the condition shown below.

<Sputtering Conditions for the First Layer 121>

Filming apparatus: Planer type DC Magnetron Sputtering apparatus

Target: Metal tantalum: Chromium=1:9 alloy

Gas and flow rate: Argon gas 70 sccm

Sputtering pressure: 0.35 pascals

Sputtering current: 5.0 amperes

Next, the second layer 122 containing molybdenum silicide as its major component and oxygen and constituting the halftone phase shift layer 120 was successively formed on the first layer in the following condition.

Here, the film thickness was about 140 nm.

<Sputtering Conditions for the Second Layer 122>

Filming apparatus: Planer type DC Magnetron Sputtering apparatus

Target: Molybdenum: silicon=1:4 (atomic ratio)

Gas and flow rate: Argon gas 50 sccm+oxygen gas 50 sccm

Sputtering pressure: 0.3 pascals

Sputtering current: 3.5 amperes

Then, a light shading layer 130 was formed in a thickness of 1000 Å by sputtering on the second layer 122, containing molybdenum silicide as its major component and oxygen and constituting the halftone phase shift layer 120, in the following condition.

<Sputtering Conditions for the Light Shading Layer 130>

Filming apparatus: Planer type DC Magnetron Sputtering apparatus

Target: Metal chromium

Gas and flow rate: Argon gas 50 sccm

Sputtering pressure: 0.3 pascals

Sputtering current: 3.5 amperes

A halftone phase shift photomask blank (transmittance: 6%) of an example 1 for KrF excimer laser exposure was thereby obtained.

In addition, a sample (test piece shown in FIG. 4) was produced in which a step was formed using a lift-off method in which a film was formed on a synthetic quartz substrate masked with a tape in the same condition and the mask was peeled off after the film was formed. Using this sample, the phase difference and transmittance for 248 nm light were measured by a phase difference measuring device (MPM248, manufactured by Laser Tech), to find that the phase difference and the transmittance were 180.12° and 6.33% respectively.

This film was immersed in a commercially available chromium etchant (MR-ES, manufactured by Ink Tech) at ambient temperature for 240 seconds to prepare a sample, whose pattern section was then observed using SEM, to find that any erosion as shown in FIG. 5d was unobserved.

Next, using the halftone phase shift photomask blank obtained in the above manner, a halftone phase shift photomask of a second example shown in FIG. 2b was produced in the following manner.

First, a resist (ZEP 7000, manufactured by Nippon Zeon Co., Ltd.) containing an organic compound as its major component was applied to the light shading layer 130 of the resulting halftone phase shift mask blank (FIG. 1b) and dried. Only a specified area of the resist was exposed to light by using an electron beam drawing device, followed by developing in the same manner as in Example 1, to obtain a resist layer 140 having a desired shape. Thereafter, using a commercially available photomask dry etcher (VLR700, manufactured by PTI), the halftone phase shift layer 120 exposed from the resist layer was selectively dry-etched by exposing the layer 120 to a high density plasma, to obtain a desired pattern of the halftone phase shift layer 120.

Here, the light shading layer 130 and the second layer 122 containing molybdenum silicide as its major component and oxygen and the first layer 121 containing a chromium tantalum alloy as its major component in the halftone phase shift layer 120 were successively etched in this order under an etching condition 1, etching condition 2 and etching condition 3 respectively.

It is to be noted that the used dry etcher had two etching process chambers and each process using the following etching conditions 1, 2 and 3 were carried out by changing the process chamber.

<Etching condition 1>

| Etching gas | $Cl_2 + O_2$ gas (2:3) |
|---|---|
| Gas pressure | 100 mTorr |
| ICP power (high density plasma was produced) | 500 W |
| Bias power (drawing power) | 25 W |
| Time | 200 seconds |

-continued

<Etching condition 2>

| Etching gas | $CF_4$ |
|---|---|
| Gas pressure | 10 mTorr |
| ICP power (high density plasma was produced) | 950 W |
| Bias power (drawing power) | 50 W |
| Time | 360 seconds |

<Etching condition 3>

| Etching gas | $Cl_2 + O_2$ gas (2:3) |
|---|---|
| Gas pressure | 100 mTorr |
| ICP power (high density plasma was produced) | 500 W |
| Bias power (drawing power) | 25 W |
| Time | 200 seconds |

Next, a resist IP3500 (manufactured by Tokyo Ohka Kogyo Co., LTD.) was applied again to the above resist layer 140 and only an area from which the halftone film was intentionally exposed was opened by a photographic method to obtain a resist layer 145 (FIG. 5a). Then, this film was immersed in a commercially available chromium etchant (MR-ES, manufactured by Ink Tech) to carry out wet etching, thereby selectively removing the light shading layer 130 of the area exposed from the resist layer 145 (FIG. 5b).

Next, the remainder resist layer 145 was peeled off by a usual method to obtain a halftone phase shift photomask having a transmittance of 6% for 248 nm light and constituting the halftone phase shift layer (FIG. 2b).

Any defect caused by the erosion of the first layer 121 containing a chromium tantalum alloy as its major component as shown in FIG. 5(d) was not found in the halftone phase shift photomask obtained in this manner.

Also in Example 2, similarly in Example 1, synthetic quartz which is the transparent substrate 110 was not almost etched and it was therefore possible to control phase difference with considerably high accuracy.

The obtained halftone phase shift photomask could be put to practical use from the viewpoint of all of the dimensional accuracy of the portion left after the peeling, sectional shape, the distribution of film thickness, the distribution of transmittance and the adhesion of the film to the substrate.

What is claimed is:

1. A blank for a halftone phase shift photomask comprising a transparent substrate and a halftone phase shift layer formed thereon, the halftone phase shift layer being provided with at least a layer containing molybdenum silicide as its major component and either one or both of oxygen and nitrogen and being formed of a multilayer film with two or more layers, wherein the multilayer film contains a layer whose major component is either one of chromium and tantalum or a chromium tantalum alloy and the layer whose major component is either one of chromium and tantalum or a chromium tantalum alloy is laminated on the side closer to the transparent substrate than the layer containing molybdenum silicide as its major component and either one or both of oxygen and nitrogen.

2. A blank for a halftone phase shift photomask according to claim 1, wherein the halftone phase shift layer is formed on the transparent substrate such that the phase difference φ given by the following equation falls in a range of $n\pi \pm \pi/3$ (n is an odd number)

$$\phi = \sum_{k=1}^{m-1} \times(k, k+1) + \sum_{k=2}^{m-1} 2\pi(u(k)-1)d(k)/\lambda$$

wherein φ is a phase change caused to the light vertically transmitting the photomask constituted of (m−2) halftone phase shift layers on the transparent substrate, x(k, k+1) is a phase change effected at the interface between a $k^{th}$ layer and a $(k+1)^{th}$ layer, u(k) and d(k) are the refractive index and film thickness of a material constituting the $k^{th}$ layer respectively and λ is the wavelength of exposure light, provided that the layer of k=1 is the transparent substrate and the layer of k=m is air.

3. A blank for a halftone phase shift photomask according to claim 1 or claim 2, wherein the halftone phase shift layer is formed on the transparent substrate in such a film thickness that the transmittance of the layer for exposure light falls in a range from 1 to 50% when the transmittance of the transparent substrate for the exposure light is defined as 100%.

4. A halftone phase shift photomask comprising a transparent substrate and a halftone phase shift layer formed thereon, the halftone phase shift layer being provided with at least a layer containing molybdenum silicide as its major component and either one or both of oxygen and nitrogen and being formed of a multilayer film with two or more layers, wherein the multilayer film contains a layer whose major component is either one of chromium and tantalum or a chromium tantalum alloy and the layer whose major component is either one of chromium and tantalum or a chromium tantalum alloy is laminated on the side closer to the transparent substrate than the layer containing molybdenum silicide as its major component and either one or both of oxygen and nitrogen.

5. A halftone phase shift photomask according to claim 4, wherein the halftone phase shift layer is formed on the transparent substrate such that the phase difference φ given by the following equation falls in a range of nπ±π/3 (n is an odd number)

$$\phi = \sum_{k=1}^{m-1} \times(k, k+1) + \sum_{k=2}^{m-1} 2\pi(u(k)-1)d(k)/\lambda$$

wherein φ is a phase change caused to the light vertically transmitting the photomask constituted of (m−2) halftone phase shift layers on the transparent substrate, x(k, k+1) is a phase change effected at the interface between a $k^{th}$ layer and a $(k+1)^{th}$ layer, u(k) and d(k) are the refractive index and film thickness of a material constituting the $k^{th}$ layer respectively and λ is the wavelength of exposure light.

6. A halftone phase shift photomask according to claim 4 or claim 5, wherein the halftone phase shift layer is formed on the transparent substrate in such a film thickness that the transmittance of the layer for exposure light falls in a range from 1 to 50% when the transmittance of the transparent substrate for the exposure light is defined as 100%.

* * * * *